United States Patent
Eckblad et al.

(10) Patent No.: US 7,017,258 B2
(45) Date of Patent: Mar. 28, 2006

(54) MOUNTING SYSTEM FOR HIGH-MASS HEATSINKS

(75) Inventors: Michael Z. Eckblad, Auburn, WA (US); Mark W. Anderson, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 161 days.

(21) Appl. No.: 10/764,976

(22) Filed: Jan. 26, 2004

(65) Prior Publication Data

US 2005/0160592 A1 Jul. 28, 2005

(51) Int. Cl.
B23P 19/00 (2006.01)

(52) U.S. Cl. .............. 29/729; 29/739; 29/740; 29/744; 29/757; 29/760; 29/832; 257/718; 257/727; 361/704; 361/719

(58) Field of Classification Search .......... 29/726, 29/729, 739, 740, 744, 757–760, 830, 832; 257/706, 707, 718–720, 727; 361/704, 709, 361/718–720
See application file for complete search history.

(56) References Cited

U.S. PATENT DOCUMENTS

| | | | |
|---|---|---|---|
| 6,109,930 A * | 8/2000 | Koschmeder et al. ......... 439/74 |
| 6,390,475 B1 | 5/2002 | Eckblad et al. | |
| 6,400,577 B1 | 6/2002 | Goodwin et al. | |
| 6,459,582 B1 | 10/2002 | Ali et al. | |
| 6,473,306 B1 * | 10/2002 | Koseki et al. ............... 361/704 |
| 6,480,387 B1 | 11/2002 | Lee et al. | |
| 6,496,371 B1 | 12/2002 | Winkel et al. | |
| 6,501,658 B1 | 12/2002 | Pearson et al. | |
| 6,512,678 B1 | 1/2003 | Sims et al. | |
| 6,545,870 B1 | 4/2003 | Franke et al. | |
| 6,552,905 B1 | 4/2003 | Herring et al. | |
| 6,563,716 B1 * | 5/2003 | Truong et al. ............... 361/816 |
| 6,778,395 B1 * | 8/2004 | Dong et al. ................. 361/704 |
| 6,803,652 B1 | 10/2004 | Winkel et al. | |
| 6,948,554 B1 * | 9/2005 | Lee et al. .................... 257/719 |
| 2002/0030972 A1 | 3/2002 | Ali et al. | |
| 2005/0007743 A1 | 1/2005 | Eckblad et al. | |

* cited by examiner

*Primary Examiner*—Minh Trinh
*Assistant Examiner*—Donghai D. Nguyen
(74) *Attorney, Agent, or Firm*—Carrie A. Boone, P.C.

(57) ABSTRACT

A system for mounting heatsinks, in particular, high-mass heatsinks, on printed circuit boards, such as motherboards. The mounting system includes a backplate, disposed beneath the motherboard, with pins protruding up through the motherboard, and a linkage assembly, which is fixably attached to a base portion of a heatsink assembly. The linkage assembly includes scoops, for grasping the pins during engagement, and a ratcheting system, for compressing the heatsink and thermal interface material onto the package. The mounting system is designed to effectively distribute the heatsink weight, as well as the forces caused by chronic and dynamic stresses, through, rather than upon the motherboard, such as to a chassis. The mounting system thus alleviates stress cracks, component pullout, solderball stress, and other damaging conditions to the motherboard. The mounting system may be engaged and disengaged without the use of tools.

22 Claims, 3 Drawing Sheets

MOUNTING SYSTEM FOR HIGH-MASS HEATSINKS

FIELD OF INVENTION

This invention relates to heatsinks, and, more particularly, mounting systems for heatsinks.

BACKGROUND OF THE INVENTION

Semiconductors, including microprocessors and other integrated circuits (ICs), generate heat during use. Current microprocessors, for example, can emit 50 watts of power or more. The temperature of the microprocessor or IC has a direct impact upon its performance. Empirical studies have shown that the failure rate doubles for every 10° C. increase in the junction temperature (i.e., the temperature of a transistor within the IC).

Unless microprocessors and other ICs are thermally managed during use, they will not operate reliably. Failures include phenomena such as junction fatigue, electromigration diffusion, thermal runway, and electrical parameter shifts. For most uses of a semiconductor device, a proper mechanism for heat dissipation is needed.

Heat may be transferred from the semiconductor by convection, radiation, or conduction. Convection is the transfer of heat by moving air. Radiation is the transfer of heat from one surface to another via electromagnetic waves. Conduction is the transfer of heat between two solids, from a higher temperature object to a lower temperature one. Each of these principles may have a part in the operation of heatsinks.

Heatsinks are devices that attach directly to a microprocessor or other hot surface to enhance heat dissipation from the surface. Heat flows from the surface to cooler air through the heatsink. A heatsink is generally designed with a first surface, for engaging directly with the microprocessor, and a second surface, for contact with the cooler air. The second surface, often formed of a plurality of projections or fins, is designed for maximum surface area, and thus maximum contact with the air, to allow heat to dissipate more quickly. The second surface may also include channels, cooling towers, tubes, cold plates, fans, refrigeration systems, or other embedded features.

Typically, a thermal interface material (TIM) is disposed between the heatsink and one or more microprocessors, known as a processor package, or package. The TIM is a synthetic pad composed of materials such as silicon or zinc oxide, which conducts heat away from the microprocessor and toward the heatsink. The TIM achieves this, in part, by evenly distributing the physical contact between the heatsink and the microprocessor.

During operation of a computer or other processor-based system, the package heats up the TIM, which conducts the heat to the surrounding heatsink. The metal in the heatsink conducts the heat to the fins, channels, tubes, or other embedded cooling elements. Where present, the heatsink fan blows air past the cooling elements to dissipate the heat to the ambient air.

One consideration when designing a heatsink is weight. Although copper-based heatsinks may be preferred over aluminum due to better heat transfer results, copper is a heavier material. A typical copper-based heatsink with a fan, for example, is over 500 grams in weight.

A motherboard or other printed circuit board (PCB) within the computer or other processor-based system typically supports the weight of the heatsink. A larger heatsink thus imposes greater stress on the motherboard than a comparable heatsink of smaller mass. A 450-gram heatsink has been shown to deflect a PCB, which can cause component damage as well as damage to the PCB traces and solder pads. Such chronic stresses can cause cracks or component pullout holes, which may damage the electrical circuitry or signal traces, possibly rendering the computer system defective or inoperable.

Dynamic stresses, such as those caused by shipment and other handling, impose particular constraints on computer systems having high-mass heatsinks. Computer systems are expected to arrive at the customer intact, despite rough handling, for example. The forces resulting from dynamic stresses may damage the motherboards that are supporting the larger heatsinks. Stress cracks, component pullout, solderball stress, or other damage to the electrical circuitry may result from such dynamic loading.

Thus, there is a continuing need for a heatsink mounting system that structurally supports large heatsinks while avoiding damage to the system motherboard during both normal operation and dynamic loading conditions.

DETAILED DESCRIPTION

In accordance with the embodiments described herein, a mounting system is disclosed that firmly mounts a heatsink to a processor on a motherboard, such as for a computer or other processor-based system. The mounting system is designed to alleviate chronic and dynamic stresses that may be imposed on the motherboard, stresses which are particularly associated with high-mass heatsinks. As used herein, high-mass heatsinks are defined to be heatsinks that weigh 400 grams or more, and, more particularly, those that weigh at least 700 grams.

Chronic stresses are defined herein to be those stresses that result from the continuous weight of the heatsink itself during normal use of the computer or other processor-based system, as well as stresses caused by the vibration of the heatsink, such as may be caused by an oscillating fan. Dynamic stresses, by contrast, are defined to be those stresses generally associated with the transportation and handling of a computer or other processor-based system, such as when the computer system is moved during shipment, and may result from such events as dropping or bumping the system.

In the following detailed description, reference is made to the accompanying drawings, which show by way of illustration specific embodiments in which the invention may be practiced. However, it is to be understood that other embodiments will become apparent to those of ordinary skill in the art upon reading this disclosure. The following detailed description is, therefore, not to be construed in a limiting sense, as the scope of the present invention is defined by the claims.

Figure 1:
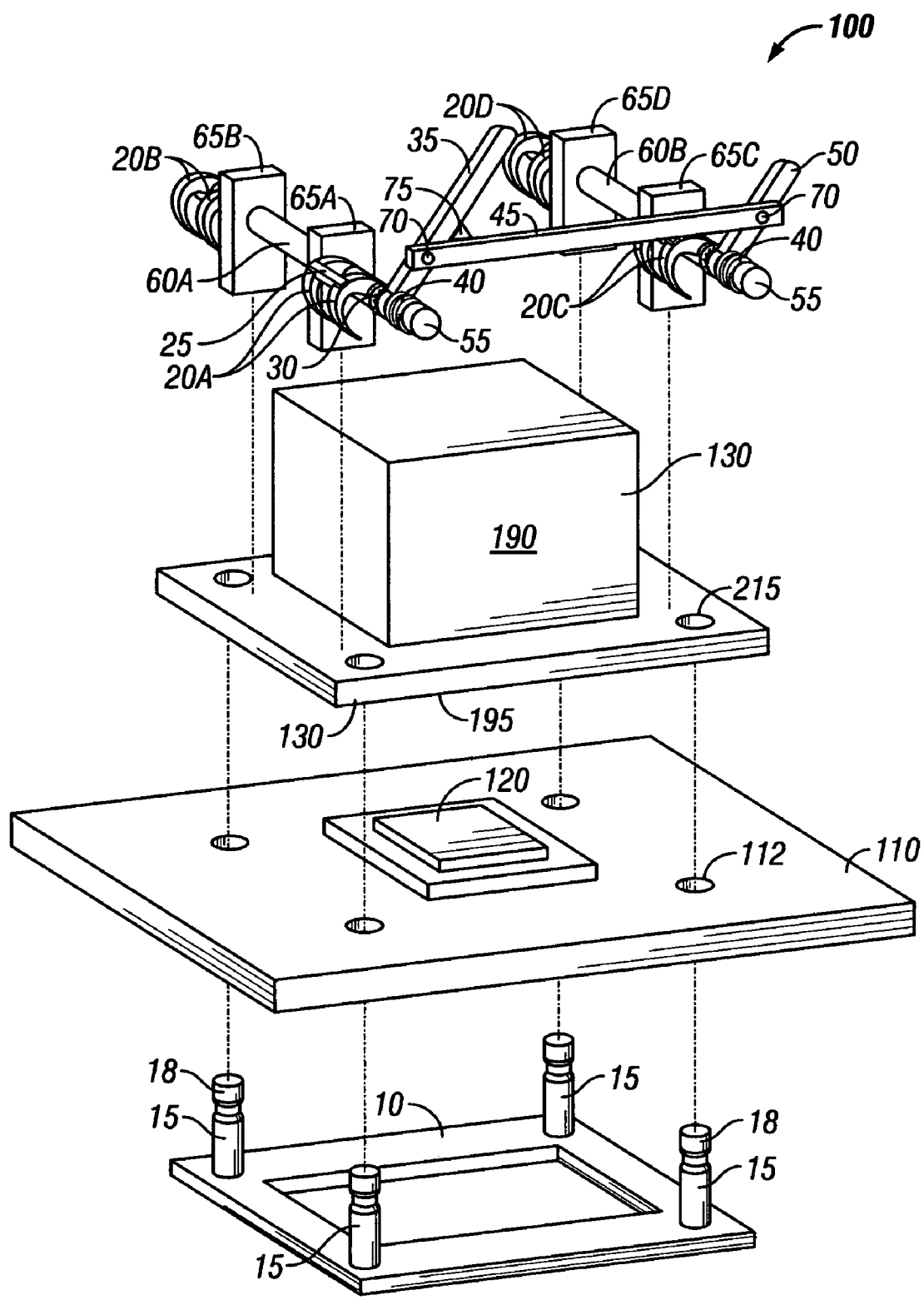
FIG. 1 is an exploded, perspective view of a mounting system, along with a motherboard including a processor package and a heatsink assembly.

FIG. 1 is an exploded perspective view of a mounting system 100, according to some embodiments. The mounting system 100 includes a linkage assembly 140 and a backplate 10, for securing a heatsink assembly 130 upon a motherboard 110. A package 120 is disposed upon the motherboard 110, and may include one or more, processors and a thermal interface material (TIM). The package 120 is the source of heat on the motherboard 110 and the heatsink assembly 130 is designed to conduct heat away from the package.

As will be shown, the mounting system 100 securely and evenly couples the heatsink assembly 130 to the package 120, for efficient transfer of heat from the package. The mounting system 100 further distributes the weight of the heatsink assembly through, rather than upon, the motherboard, to the backplate 10, thus reducing the adverse effects of both chronic and dynamic stresses.

The backplate 10 is a rigid structure that includes a plurality of transversely disposed mounting pins 15. The backplate 10 may be composed of metal, such as aluminum, and may be a solid plate, a rectangular structure, such as in FIG. 1, a cross-bar structure, a circular structure, or may conform to a variety of other shapes. The backplate 10 may be an autonomous structure or it can be mounted to a chassis or other structure.

The backplate 10 is disposed beneath the motherboard, with the mounting pins 15 facing the motherboard. The motherboard 110 includes a plurality of holes 112, through which the mounting pins 15 are inserted. The heatsink assembly 130 includes a body 195 and a base portion 190, the width of the body being smaller than the width of the base portion. Like the motherboard 110, the base portion 190 features a plurality of holes 215 for receiving the mounting pins 15. The holes 215 in the heatsink base 195 and the holes 112 in the motherboard 110 have substantially the same spatial configuration and are aligned with one other, as well as with the mounting pins.

Although the body 195 of the heatsink assembly 130 is depicted as a simple, featureless structure, the heatsink body 195 may also include fins, channels, tubes, embedded fans, top-mounted fans, and other cooling elements not shown in FIG. 1. The base portion 195 of the heatsink assembly 130 may include a cavity (not shown), which is approximately the size of the package 120 mounted on the motherboard 110. The base portion 195 of the heatsink assembly 130 is not thicker than the package 120. These dimensions ensure that the heatsink body 190 makes direct contact with the package 120 when the mounting system 100 is fully engaged. An evenly distributed contact between the heatsink body 190 and the package 120 ensures efficient conduction of heat away from the package.

The mounting pins 15 attached to the backplate 10 are inserted through the loose-fitting holes 112 in the motherboard, then through the holes 215 in the heatsink assembly 130, so as to protrude above the base portion 195 of the heatsink assembly.

Figure 2:
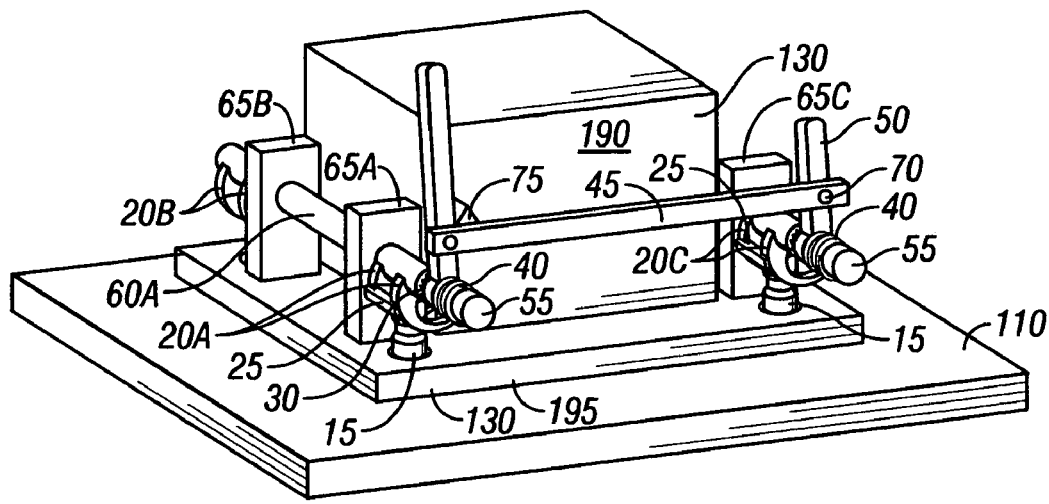
FIG. 2 is a perspective view of the mounting system of FIG. 1 in a fully engaged position.

When the mounting system 100 is engaged, the linkage assembly 140, which is fixably attached to the base portion 195 of the heatsink assembly, latches through the mounting pins 15, to securely unite the heatsink assembly 130 to the package 120 on the motherboard 110. In this manner, the heatsink assembly 130 is tightly and evenly coupled to the package 120. A fully engaged mounting system 100 is depicted in FIG. 2.

The linkage assembly 140 is a mechanical assembly that, when engaged, compresses the heatsink assembly 130 onto the package 120. The linkage assembly 140 includes a structural assembly and a ratchet assembly. The structural assembly includes scoops 20A, 20B, 20C, and 20D (collectively, scoops 20), rotational rods 60A and 60B (collectively, rotational rods 60), partially thread bolts 55, and pressure blocks 65A, 65B, 65C, and 65D (collectively, pressure blocks 65). The ratchet assembly includes a ratchet handle 35, ratchet gears 30, ratchet springs 40, a ratchet bar 45, a secondary ratchet handle 50, rotational pins 70, and a latch 75.

The pressure blocks 65 are fixably attached to the base portion 195 of the heatsink assembly 130, allowing the other features of the structural assembly to essentially surround the heatsink body 190, during both engagement and disengagement. The pressure blocks 65 may be attached to the base portion 195 using a high-temperature adhesive, weld, screws, or other material for securely and permanently affixing them. In FIG. 1, the pressure blocks 65 are disposed proximal and adjacent to the holes 215, as indicated by the dotted lines. However, other configurations of the pressure blocks are possible, so long as the linkage assembly 140 is fixably mounted to the base and surrounds the body of the heatsink assembly.

The rotational rods 60 are each threaded through two of the pressure blocks 65. The rotational rod 60A is threaded through the pressure blocks 65A and 65B while the rotational rod 60B is threaded through the pressure blocks 65C and 65D, such that the rotational rods are transverse to the pressure blocks. The rotational rods 60 are preferably made from a sturdy, yet lightweight, material, such as aluminum or titanium, or a composite material designed for strength and low weight.

The ratchet handle 35 is coupled to the rotational rod 60A by way of a cylindrical end member 185, while the secondary ratchet handle 50 is similarly coupled to the rotational rod 60B. A ratchet bar 45 connected between the ratchet handle 35 and the secondary ratchet handle 50 ensures that when the ratchet handle 35 is moved, the secondary ratchet handle 50 moves in a substantially similar fashion. A pin 70 is disposed transversely through a lower portion of the ratchet handle 35, for pivotable connection to one end of the ratchet bar 45. A second pin 70 is disposed transversely through a lower portion of the secondary ratchet handle 50, for pivotable connection to the other end of the ratchet bar 45. The ratchet assembly may be formed using lightweight, sturdy materials.

When the ratchet assembly is engaged, the ratchet bar 45 effectively transfers any rotational motion of the ratchet handle 35 to the secondary ratchet handle 50. The ratchet bar 45 maintains a substantially parallel orientation between the ratchet handle 35 and the secondary ratchet handle 50, during any movement of the assembly. The ratchet handle 35 and the secondary ratchet handle 50 (as well as their respective rotational rods 60A and 60B) rotate simultaneously and in the same orientation.

The rotational rods 60, which may be somewhat close-fitting through the pressure blocks 65, are nevertheless capable of rotating in both clockwise and counter-clockwise directions. When the ratchet handle 35 is moved, such as during engagement of the ratchet assembly, both rotational rods 60 move in the same direction and to the same degree. For example, when the ratchet handle 35 moves from the unengaged position (FIG. 1) to the engaged position (FIG. 2), both rotational rods 60 move in a counter-clockwise direction. When the ratchet handle returns to the unengaged position, both rotational rods move in a clockwise direction, back to their original positions.

Scoops 20 are attached at the ends of each rotational rod 60 and are disposed transverse to the rods. Each scoop 20 is approximately adjacent to one corner of the heatsink body 190. Rotational rod 60A is threaded through scoop 20A and 20B while rotational rod 60B is threaded through scoop 20C and 20D. The scoops 20 mate with the mounting pins 15 when the mounting system 100 is engaged, providing a secure, yet even coupling between the heatsink body 190 and the package 120. The configuration and operation of the scoops 20 are more particularly described in FIGS. 5 and 6, below.

In FIG. 2, the mounting system 100 is shown in its fully engaged position. The ratchet handle 35 has been moved to the left, as compared to FIG. 1, such that each of the scoops 20 grapple, grasp, or otherwise engage with their respective mounting pins 15, for a secure connection between the linkage assembly 140 and the backplate 10 (not shown). The mounting pins 15 are visible above the base portion 195 of the heatsink assembly 130. The secure engagement of the mounting system 100 ensures that the heatsink body 190 is pressed against the package 120 on the motherboard 110.

Also part of the ratchet assembly, a latch 75 is disposed between the ratchet bar 45 and the ratchet handle 35. When the latch is set, the ratchet handle 35 is unable to move. This inhibits the unintentional disengagement of the mounting system 100. Designers of ordinary skill in the art can appreciate many other ways to fasten the ratchet handle 35 such that unintended movement is avoided.

Figure 3:
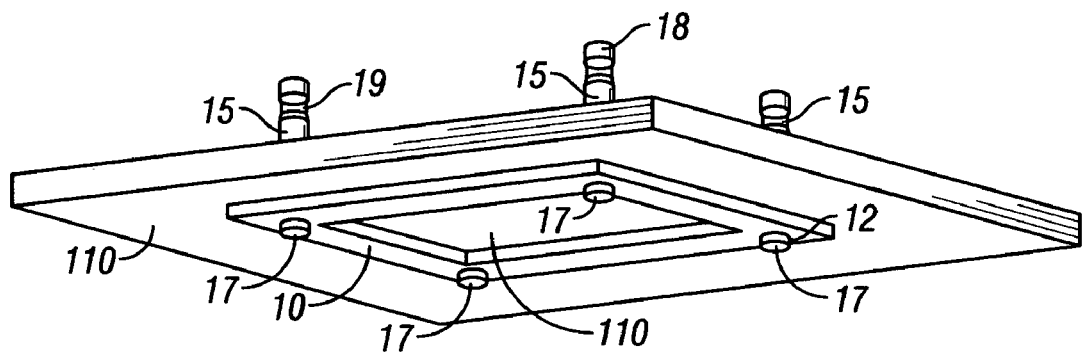
FIG. 3 is a perspective view of the backplate of the mounting system of FIG. 1.

FIG. 3 is a perspective view of the backplate 10, which is to be positioned beneath the motherboard (not shown). The backplate 10 includes holes 12, for receiving each of the mounting pins 15. The mounting pins 15 each include a head 17 at one end of the shank, whose diameter is large enough to keep the end of each mounting pin beneath the backplate, while the shank of each mounting pin is threaded through the motherboard 110, then through the base 195 of the heatsink assembly 130.

At the other end of the shank, the mounting pins each include a channel 19 and a tip 18. The diameter of each channel is slightly smaller than the diameter of the tip. The channels 19 of the mounting pins facilitate engagement by the scoops 20. In the figures, the diameter of the tip 18 is substantially the same as the diameter of the shank of the mounting pin. However, the diameter of the shank of the mounting pin may instead be substantially the same as the diameter of the channel. The engagement mechanism, which is described in more detail, below, is effective when the diameter of the tip 18 is greater than the diameter of the channel 19.

By coupling the heatsink assembly 130 to the backplate 10 via the mounting pins 15, where the backplate is attached to a chassis, chronic or dynamic stresses that may be imposed on the motherboard 110 due to the weight of the heatsink assembly 130 are substantially avoided. Instead, the backplate 10 and the mounting pins 15 of the mounting system 100 help to distribute the weight of the heatsink transverse to or through, rather than upon, the motherboard 110. By contrast, a motherboard upon which a high-mass heatsink is mounted directly is likely to be damaged or rendered inoperable. Thus, the mounting system 100 provides a mechanism by which high-mass heatsinks can be used on a computer or other processor-based system, without imposing limitations on the system's use, so as to avoid dynamic and/or chronic stresses.

Figure 4:
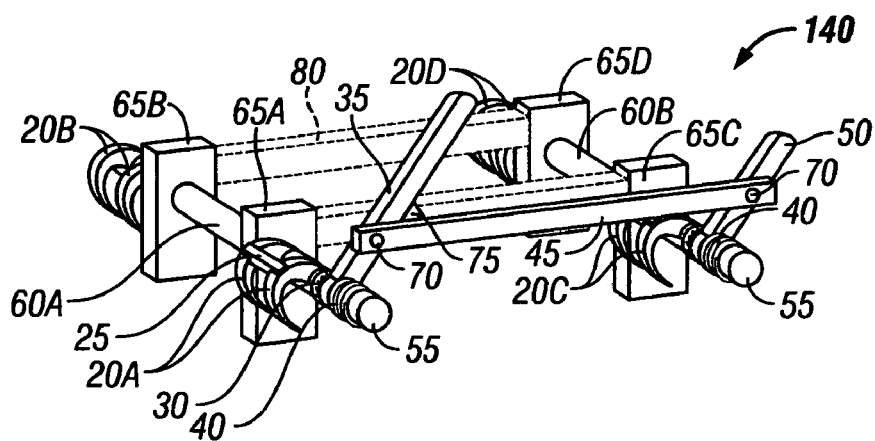
FIG. 4 is a perspective view of the linkage assembly of the mounting system of FIG. 1.

In FIG. 4, a perspective view of the linkage assembly 140 is shown, without the heatsink assembly 130. A pair of optional support bars 80 is depicted, using dashed lines. These support bars may be disposed between the pressure blocks for connection thereto. Thus, a first support bar 80 connects the pressure block 65A and the pressure block 65D together while a second support bar 80 connects the pressure block 65B and 65C together. The support bars 80 and the rotational rods 60 thus form a rectangular structure that surrounds the heatsink body (not shown), and helps to maintain the shape of the linkage assembly 140.

Figure 5:
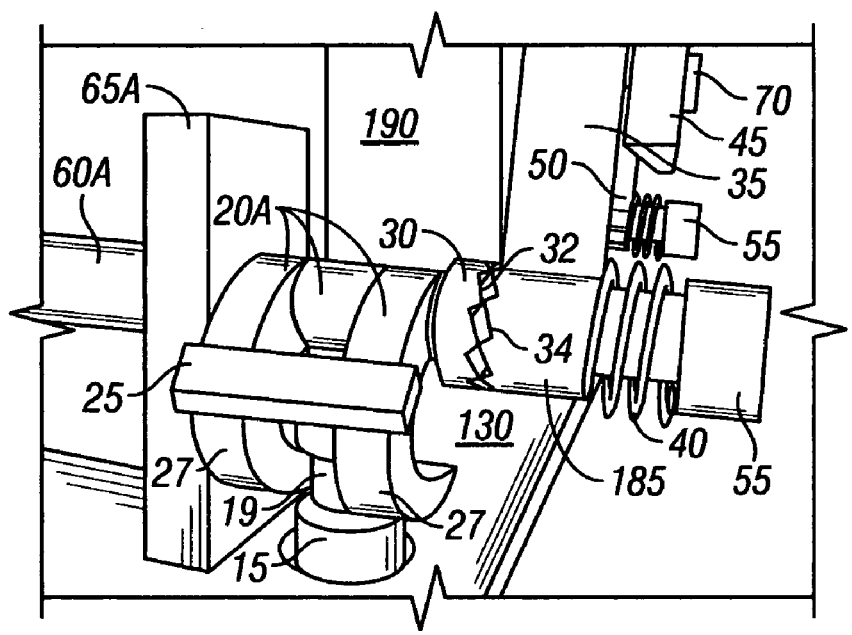
FIG. 5 is a close-up perspective view of the scoop portion of the linkage assembly of FIG. 4.
Figure 6:
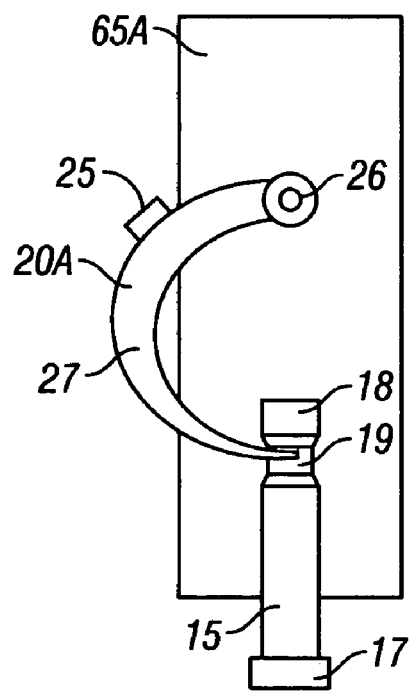
FIG. 6 is a side view of the scoop of the linkage assembly of FIG. 4.

FIG. 5 is a close-up perspective view of the scoop 20A and associated hardware used in the mounting system 100, according to some embodiments. FIG. 6 is a side view of the scoop as it relates to the mounting pins 15 of the backplate 10. The scoops 20 of the linkage assembly 140 are described in more detail with FIGS. 5 and 6 in mind.

Each scoop 20 includes a hole 26, through which the rotational rods 60 are threaded, as illustrated in FIG. 6. The scoops 20A and 20B are threaded through the rotational rod 60A while the scoops 20C and 20D are threaded through the rotational rod 60B. The hole 26 in each scoop is small enough that the rotational rod is tightly coupled to each scoop. Thus, when the ratchet handle 35 moves the rotational rods, the scoops move with the rotational rods.

The scoop 20A in FIG. 5 includes two side-by-side claws 27, disposed transverse to the rotational rod 60. The claws 27 are roughly crescent-shaped. The claws 27 are to be positioned on either side of their respective mounting pins 15 during engagement of the mounting system 100. Recall that each mounting pin 15 of the backplate 10 includes a channel 19 and a tip 18, in which the diameter of the channel is smaller than the diameter of the tip. The distance between the claws 27 of the scoop 20A is slightly longer than the diameter of the channel 19 of the mounting pin 15, but shorter than the diameter of the tip 18. This ensures that a portion of the claws 27 is disposed beneath the tip of the mounting pin, substantially inhibiting movement of the mounting pin or the linkage assembly, once engagement of the mounting system 100 occurs.

When the ratchet handle 35 is moved to actuate or engage the linkage assembly 140, the claws 27 rotate, along with the rotational rods 60. The inner surface of each claw is ramped slightly upward so that, when the mounting system 100 is engaged, the claws 27 actually pull their respective mounting pins upward slightly, for a tight coupling between the linkage assembly and the backplate 10. Because of the ramp on each scoop 20, a specified force will be applied to the package 120 that may be quite low. However, the ability of the scoop to resist pullout loads during dynamic events is very high, in some embodiments.

In other embodiments, the tips 18 of the mounting pins 15 are replaced with an eye or loop, while the scoops 20 include a single claw rather than two claws, for engagement through the loop. In other embodiments, the mounting pins 15 have a cross-bar member instead of a tip and a channel, such that the claws 27 of the scoops 20 can effectively grasp the mounting pins. Mechanical designers of ordinary skill in the art recognize a variety of possible implementations for effectively grasping the mounting pins by the scoops.

The scoop 20A includes a reverse stop 25. The reverse stop 25 is transverse to the claws 27 and parallel to the rotational rod 60A. The width of the reverse stop 25 slightly exceeds the width of the claws 27, one of which is proximal to the pressure block 65A.

When the mounting system 100 is fully engaged, the reverse stop 25 makes contact with a lower portion of the pressure block, inhibiting further movement of the scoop. At this point, the claws 27 are fully engaged with the tip 18 of the mounting pin 15, and a tight engagement between the linkage assembly 140 and the backplate 10 is achieved. When the mounting system is fully disengaged, the reverse stop makes contact with an upper portion of the pressure block, also inhibiting further movement of the scoop. At this point, the claws are fully disengaged from the tip 18, and the heatsink assembly 130, including the linkage assembly 140, may be removed from the motherboard 110.

The scoop 20A may include a ratchet gear 30, such as is depicted in FIG. 5. The ratchet gear 30 is cylindrical, so as to completely surround the rotational rod 60, with gear teeth 32 extending along one side of the cylinder. In some embodiments, the scoop 20A includes a ratchet gear 30 while the scoops 20B, 20C, and 20D include no ratchet gear. In other embodiments, scoops 20A and 20C (i.e., scoops on one side of the linkage assembly) include ratchet gears. Like the scoop, the ratchet gear 30 does not freely rotate on the rotational rod 60A, but moves with the rotational rod during engagement and disengagement. Thus, while the end portion 185 of the ratchet handle 35 rotates, the ratchet gear 30 is fixed to the rotational rod 60.

In addition to the scoop 20A, the close-up view of FIG. 5 also depicts the ratchet handle 35 in more detail. The ratchet handle 35 includes an end portion 185, which extend from the base of and is disposed transverse to the ratchet handle. The end portion 185 of the ratchet handle 35 includes gear teeth 34, which are disposed facing the gear teeth 32 of the ratchet gear 30. The ratchet handle 35 and end portion 185 may be molded as a single piece of material. Like the ratchet gear 30, the end portion 185 is cylindrical, for mating with the ratchet gear 30.

The gear teeth 34 of the end portion 185 mesh with the gear teeth 32 of the ratchet gear 30. Accordingly, when the ratchet handle 35 rotates, the rotational rod 60A rotates and the scoops 20A and 20B (as well as the rotational rod 60B and the scoops 20C and 20D) move simultaneously. Once the enmeshed gear teeth begin making a clicking noise, the desired torque of the rotational rods 60 is achieved. The secondary ratchet handle 50 may also have gear teeth for coupling to a second ratchet gear (not shown).

The gear teeth 32 of the ratchet gear 30 and the gear teeth 34 of the end portion 185 are characterized by two slopes, a small slope and a steep slope, according to some embodiments. When the mounting system 100 is engaged, the relatively smaller slope of the gear teeth ensure that, if the ratchet handle 35 is rotated excessively, the gear teeth 32 of the ratchet gear 30 and the gear teeth 34 of the end member 185 slip past one another under the force of the ratchet springs 40, rather than further compressing. The shallow slope along with the spring force of the ratchet springs 40 controls how much install force occurs for the package 120 and the heatsink assembly 130. The steep slope ensures that the scoops 20 can be disengaged at all times, since the steep slope will provide higher forces than the shallow slope. As the reverse stop 25 makes contact with the pressure blocks 65A during disengagement, the ratchets are reset to ensure adequate throw for a subsequent engagement of the linkage assembly 140. As the desired torque is achieved, the backplate 10 is pulled up against the motherboard 110 at the same time the heatsink body 190 is pulled against the package 120. The opposing force of the backplate against the weight of the heatsink substantially inhibits deflection of the motherboard, according to some embodiments.

Also shown in FIG. 5, the rotational rod 60A may be threaded on one or both ends to accept partially threaded bolts 55. The bolts 55 hold the various threaded components in place. A ratchet spring 40, disposed between the bolt 55 and the end portion 185 of the ratchet handle 35, provides a force in the direction of, or parallel to, the rotational rod 60, for holding the opposing teeth 34 and 34 together. (Rotational rod 60B may likewise include bolts as well as a ratchet spring.) Mechanical designers of ordinary skill will recognize that other springs and configurations may be employed to provide a force for holding the opposing gear teeth together.

The ratchet spring 40 produces a force against the ratchet gear 30 and the end portion 185. Additionally, when the mounting system 100 is engaged, the scoops 20 produce a rotational force. Each scoop 20 engages with the tip 18 of its respective mounting pin 15, causing a force to push on the base 195 of the heatsink assembly 130. These forces thus provide compression between the heatsink assembly 130 and the package 120. The strength of the ratchet spring 40 can be selected to achieve the desired compression between the heatsink assembly 130 and the package 120. The distribution of the scoops 20 and the mounting pins 15 along the outer region of the heatsink body 190 ensures that the compression is evenly distributed, thus facilitating the even conduction of heat away from the package to the heatsink.

The mounting system 100 thus provides a mechanism for distributing the weight of the heatsink transverse to the motherboard 110, thus minimizing the possibility of board and/or component damage thereon. The placement of the linkage assembly 140, the backplate 10, and the mounting pins 15 so as to surround the heatsink body 190 facilitates the even distribution of the heatsink weight, promoting an even distribution of contact between the heatsink body 190 and the package 120. The number of scoops, pressure blocks and mounting pins used by the mounting system 100 may vary.

The mounting system 100 may be assembled, according to some embodiments, as follows. The linkage assembly 140 is permanently affixed to the base 195 of the heatsink assembly 130. At this point, the heatsink assembly need not be coupled to the motherboard 110. The backplate 10 is attached to the underside of the motherboard 110, aligned with the package 120, and the mounting pins 15 are threaded through the holes 112 in the motherboard. The operations for installing the linkage assembly 140 and the backplate 10 may be performed in reverse order.

Once the mounting pins 15 are protruding from the motherboard 110, the heatsink assembly 130 may be lowered onto the package 120. The mounting pins are threaded through the holes 215 in the heatsink base 195. The mounting system 100 is thus assembled for use. Accordingly, the ratchet handle 35 of the linkage assembly 140 is actuated or engaged, causing the scoops 20 to grasp their respective mounting pins 15. Once the gear teeth 32 of the ratchet gear 30 and the gear teeth 34 of the end member 185 begin clicking, the mounting system 100 is fully engaged and actuation of the ratchet handle 35 may cease. The latch 75 located between the ratchet handle 35 and the ratchet bar 45 may be engaged, as a safety mechanism, to ensure that the fully engaged position of the linkage assembly 140 is maintained. The engagement of the mounting system 100 is thus complete.

To disengage the mounting system 100, the following operations are performed. The latch 75 is unfastened, freeing the linkage assembly 140. The ratchet handle 35 is then moved back to its original, unengaged position (a shift to the right, in the figures). The gear teeth 32 of the ratchet gear 30 and the gear teeth 34 of the end member 185 remain engaged, causing the scoops 20 to retract, freeing the respective mounting pins 15 from their grasp. Next, the reverse stop 25 hits the pressure block 65A and the force of the ratchet spring 40 is overcome. The ratchet gear 30 and the end portion 185 move relative to one another, causing the entire linkage system to be reset for a subsequent installation of a heatsink assembly. Once the ratchet handle 35 is returned to its original position, the linkage assembly 140, the heatsink assembly 130, to which the linkage assembly is now permanently attached, and the backplate 10 can be removed from the motherboard 110.

The mounting system 100 advantageously achieves the desired compression between the heatsink body 190 and the package 120, facilitating the efficient transfer of heat away from the package. For some heatsink assemblies, the package pushes against the motherboard, resulting in an unnecessarily high displacement gradient (solderball stress), particularly for installations involving two or more processors, and an associated risk of solderball cracks in durability testing.

The mounting system 100 provides a particular package load for a wide tolerance range and controls deflection of the motherboard 110 due to chronic stresses. The structure of the mounting system 100, which causes the weight of the heatsink to be distributed through rather than upon the motherboard, or passed directly to the chassis via a direct attachment of the backplate 10 to the chassis, also provides a very stiff resistance to dynamic loads, such as may occur when the computer or other processor-based system is dropped or bumped. The mounting system 100 thus provides a systematic approach to achieving a specified, relatively low force on the package, satisfying TIM limitations, while providing a high load resistance for dynamic loads that substantially reduces the possibility of package pullout and TIM separation.

The mounting system 100 further provides a tool-less approach to processor/heatsink installations. Some heatsink installations involve multiple threaded screws and standoffs, which must be individually removed and re-inserted when the processor is added, replaced, or otherwise serviced. By contrast, the mounting system 100 makes processor and heatsink installations tool-less.

While the invention has been described with respect to a limited number of embodiments, those skilled in the art will appreciate numerous modifications and variations therefrom. It is intended that the appended claims cover all such modifications and variations as fall within the true spirit and scope of the invention.

We claim:

1. A mounting system, comprising:
   a backplate for positioning beneath a processor package on a motherboard, the backplate having a plurality of pins extending upward from and transverse to the backplate, the pins each including a tip; and
   a linkage assembly disposed upon a heatsink assembly, the heatsink assembly comprising a base portion, the linkage assembly comprising:
      a first rod disposed transverse through a first pressure block and a second pressure block;
      a second rod disposed transverse through a third pressure block and a fourth pressure block, wherein the first, second, third, and fourth pressure blocks are permanently affixed to the base portion of the heatsink assembly;
      a pair of scoops, a first scoop being threaded through and transverse to the first rod, a second scoop being threaded through and transverse to the second rod, each scoop including a pair of claws for grasping the tip of the pins; and
      a ratchet assembly for coupling the linkage assembly with the backplate; wherein the claws securely grasp the tip of the pins such that the heatsink assembly is pulled toward the processor package while the backplate provides an opposing force to the heatsink assembly.

2. The mounting system of claim 1, wherein the pins of the backplate are threaded through holes in the motherboard as well as through holes in the base portion of the heatsink assembly.

3. The mounting system of claim 2, the ratchet assembly further comprising:
   a ratchet handle including an end member with gear teeth, the end member being cylindrical, wherein the end member is threaded through the first rod;
   a secondary ratchet handle including a cylindrical end portion, for threading through the second rod;
   a ratchet bar coupled between the ratchet handle and the secondary ratchet handle such that, when the ratchet handle is moved, the secondary ratchet handle moves such that the ratchet handles are substantially parallel to one another; and
   a ratchet gear threaded through the first rod, the ratchet gear being adjacent to the end member of the ratchet handle, the ratchet gear having teeth which face the gear teeth of the end member.

4. The mounting system of claim 3, wherein the teeth and the gear teeth make a clicking noise when the mounting system is fully engaged.

5. The mounting system of claim 3, the ratchet assembly further comprising a latch for inhibiting movement of the ratchet assembly once the mounting system is fully engaged.

6. The mounting system of claim 3, further comprising:
   a bolt disposed at one end of the first rod; and
   a ratchet spring, disposed between the bolt and the end member of the ratchet handle;
wherein the ratchet spring provides a force parallel to the first rod, such that the gear teeth of the end member and the teeth of the ratchet gear remain substantially coupled.

7. The mounting system of claim 6, further comprising:
   a second ratchet gear threaded through the second rod, the second ratchet gear having teeth and being adjacent to a secondary ratchet handle end member, wherein the secondary ratchet handle end member includes gear teeth which face the teeth of the second ratchet gear.

8. The mounting system of claim 7, further comprising:
   a second bolt disposed at one end of the second rod; and
   a second ratchet spring, disposed between the second bolt and the secondary ratchet handle end member;
wherein the second ratchet spring provides a force parallel to the second rod, such that the gear teeth of the secondary ratchet handle end member and the teeth of the ratchet gear remain substantially coupled.

9. The mounting system of claim 1, each pin of the plurality of pins further comprising: a channel disposed beneath the tip of each pin, the channel having a channel diameter is smaller than the tip diameter.

10. The mounting system of claim 9, wherein the heatsink assembly further comprises a heatsink body, the heatsink body having a width smaller than the base portion.

11. The mounting system of claim 10, further comprising:
   a second pair of scoops, a third scoop being threaded through and transverse to the first rod, a fourth scoop being threaded through and transverse to the second rod, wherein the scoops are approximately adjacent to each corner of the heatsink body.

12. The mounting system of claim 10, wherein the pressure blocks are adjacent to the heatsink body.

13. The mounting system of claim 10, the base portion of the heatsink assembly further comprising a cavity such that the heatsink body is directly coupled to the processor package when the mounting system is fully engaged.

14. The mounting system of claim 1, wherein the scoops are ramped so that, during engagement with the pins, a force applied to the processor package is low.

15. The mounting system of claim 1, further comprising a reverse stop coupled to and transverse to the pair of claws, the reverse stop being substantially parallel to the first rod, wherein the reverse stop makes contact with the first pressure block when the mounting system is fully engaged.

16. The mounting system of claim 15, wherein the reverse stop makes contact with the first pressure block when the mounting system is fully disengaged.

17. A mounting system, comprising:
   a backplate for positioning beneath a processor package on a motherboard, the backplate having a plurality of pins extending upward from and transverse to the backplate; and
   a linkage assembly disposed upon a heatsink assembly, the heatsink assembly comprising a base portion and having a predetermined weight, the linkage assembly comprising:
      a first rod disposed transverse through a first pressure block and a second pressure block;
      a second rod disposed transverse through a third pressure block and a fourth pressure block, wherein the first, second, third, and fourth pressure blocks are permanently affixed to the base portion of the heatsink assembly;
      a pair of scoops, a first scoop being threaded through and transverse to the first rod, a second scoop being threaded through and transverse to the second rod; and
      a ratchet assembly for coupling the linkage assembly with the backplate;
   wherein the predetermined weight of the heatsink assembly is absorbed by the mounting pins and backplate when the mounting assembly is fully engaged.

18. The mounting system of claim 17, the ratchet assembly further comprising:
   a ratchet handle including an end member with gear teeth, the end member being cylindrical, wherein the end member is threaded through the first rod; and
   a ratchet gear threaded through the first rod, the ratchet gear being adjacent to the end member of the ratchet handle, the ratchet gear having teeth which face the gear teeth of the end member.

19. The mounting system of claim 18, wherein the teeth and the gear teeth make a clicking noise when the mounting system is fully engaged.

20. The mounting system of claim 19, the ratchet assembly further comprising:
   a secondary ratchet handle including a cylindrical end portion, for threading through the second rod;
   a ratchet bar coupled between the ratchet handle and the secondary ratchet handle such that, when the ratchet handle is moved, the secondary ratchet handle moves such that the ratchet handles are substantially parallel to one another; and
   a latch for inhibiting movement of the ratchet assembly once the mounting system is fully engaged.

21. The mounting system of claim 18, further comprising:
   a bolt disposed at one end of the first rod; and
   a ratchet spring, disposed between the bolt and the end member of the ratchet handle;
wherein the ratchet spring provides a force parallel to the first rod, such that the gear teeth of the end member and the teeth of the rachet gear remain substantially coupled.

22. The mounting system of claim 17, further comprising:
   a second pair of scoops, a third scoop being threaded through and transverse to the first rod, a fourth scoop being threaded through and transverse to the second rod, wherein the scoops are ramped so that, during engagement with the pins, a force applied to the processor package is low.

* * * * *